(12) United States Patent
Tseng

(10) Patent No.: US 6,642,570 B2
(45) Date of Patent: Nov. 4, 2003

(54) STRUCTURE OF FLASH MEMORY WITH HIGH COUPLING RATIO

(75) Inventor: Horng-Huei Tseng, Hsin-Chu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/852,405

(22) Filed: May 9, 2001

(65) Prior Publication Data

US 2002/0167041 A1 Nov. 14, 2002

(51) Int. Cl.[7] .............................................. H01L 29/788
(52) U.S. Cl. ........................ 257/315; 257/315; 257/406
(58) Field of Search ................................. 257/315, 412, 257/378; 438/257, 267, 264, 266; 437/13

(56) References Cited

U.S. PATENT DOCUMENTS

| | | | | |
|---|---|---|---|---|
| 5,108,939 A | * | 4/1992 | Manley et al. | 437/43 |
| 5,915,176 A | * | 6/1999 | Lim | 438/257 |
| 6,049,114 A | * | 4/2000 | Maiti et al. | 257/412 |
| 6,171,909 B1 | * | 1/2001 | Ding et al. | 438/267 |
| 6,228,716 B1 | * | 5/2001 | Wanlass | 438/264 |
| 6,235,589 B1 | * | 5/2001 | Meguro | 438/267 |
| 6,274,434 B1 | * | 8/2001 | Koido et al. | 438/266 |

* cited by examiner

Primary Examiner—David Nelms
Assistant Examiner—Thinh T. Nguyen
(74) Attorney, Agent, or Firm—Clement Cheng

(57) ABSTRACT

The flash memory structure includes a substrate having trenches formed therein, a first dielectric layer and a first conductive layer are stacked on the substrate. Isolations are formed in the trenches and protruding over the surface of the substrate, wherein the first conductive layer is also protruded over the isolations. A second conductive layer is lying the surface of the first conductive layer and a second dielectric layer formed thereon. A third conductive layer is formed on the second dielectric layer. The floating gate is consisted of first conductive layer and the second conductive layer.

7 Claims, 2 Drawing Sheets

STRUCTURE OF FLASH MEMORY WITH HIGH COUPLING RATIO

The present invention relates to a semiconductor device, and more specifically, to a method of fabricating flash memories and the structure of the same.

BACKGROUND OF THE INVENTION

Various nonvolatile memories have been disclosed in the prior art. For example, Mitchellx has proposed EPROMs with self-aligned planar array cell. In this technique, buried diffusion self-aligned to the floating gate avalanche injection MOS transistors are used for the bit lines. Cross point array technology has been disclosed. The self-aligned source and drain will allow this device to be optimized even further for programming speed. See A. T. Mitchellx, "A New Self-Aligned Planar Cell for Ultra High Density EPROMs", IEDM, Tech. pp. 548–553, 1987".

Flash memory is one of the segments of nonvolatile memory devices. The device includes a floating gate to storage charges and an element for electrically placing charge on and removing the charges from the floating gate. One of the applications of flash memory is BIOS for computer. Typically, the high-density nonvolatile memories can be applied as the mass storage of portable handy terminals, solid state camera and PC cards. That is because that the nonvolatile memories exhibit many advantages, such as a fast access time, low power dissipation, and robustness. Bergemont proposed another cell array for portable computing and telecommunications application, which can be seen in Bergmont et al., "Low Voltage NVG™: A New High Performance 3 V/5 V Flash Technology for Portable Computing and Telecommunications Applications", IEEE Trans. Electron Devices, vol. ED-43, p. 1510, 1996. This cell structure is introduced for low voltage NOR Virtual Ground (NVG) flash memory having fast access time. In the flash array schematic, field oxides (FOX) are formed between cells such that a poly extension on FOX of each cell provides adequate gate coupling ratio. Bergmont also mentioned that the portable telecommunications and computing have become a major driving force in the field of integrated circuits. In the article, the access time is one of the key concerns for low voltage read operation. The NVG array uses select devices to achieve a fast access time by reducing the pre-charge time to that of a single segment rather than the full bit-line.

The formation of nonvolatile memories toward the trends of low supply power and fast access, because these requirements are necessary for the application of the mobile computing system. Flash memory needs the charges to be hold in the floating gate for a long periods of time. Therefore, the dielectric that is used for insulating the floating gate needs to be high performance. At present, the low voltage flash memory is applied with a voltage of about 3V or 5V during charging or discharging the floating gate. As known in the art, tunneling is a basic technology in charging or discharging. In order to attain high tunneling efficiency, the thickness of the dielectric between the floating gate and substrate have to be scaled down due to the supply voltage is reduced.

U.S. Pat. No. 6,180,459 to Sheu, entitled "Method for fabricating a flash memory with shallow trench isolation", filed on Jan. 8, 1999. The prior art disclosed a method for fabricating a flash memory comprising forming a shallow trench isolation (STI) structure is also formed in the method. A further U.S. Pat. No. 6,172,395 to Chen, et al., entitled "Method of manufacture of self-aligned floating gate, flash memory cell and device manufactured thereby" and assigned to Taiwan Semiconductor Manufacturing Company (Hsin-Chu, TW).

A further prior article can be seen in U.S. Pat. No. 6,171,909 to Ding, et al., entitled "Method for forming a stacked gate" and assigned to United Semiconductor Corp. (Hsinchu, TW) and the prior art is filed on Apr. 16, 1999. The method includes forming a first dielectric layer, a conductive layer and a silicon nitride layer sequentially over a substrate. A photoresist pattern is formed over the silicon nitride layer. The silicon nitride layer, conductive layer, first dielectric layer and substrate are etched by using the photoresist pattern as an etching mask until forming a plurality of trenches in the substrate. An insulating layer is formed over the substrate. A conductive spacer is formed on the sidewalls of the conductive layer and silicon nitride layer, wherein the conductive spacer and conductive layer serve as a first gate conductive layer. The silicon nitride layer is removed. A second dielectric layer and a second gate conductive layer are formed over the substrate. The second gate conductive layer, second dielectric layer and first gate conductive layer are patterned to form a control gate, a patterned dielectric layer and a floating gate, respectively.

SUMMARY OF THE INVENTION

The object of the present invention is to form a self-aligned floating gate with higher coupling ratio.

The further object is to form the floating gate and trench without switching the chamber.

The yet object of the present invention is to form the floating gate and trench, simultaneously.

The present invention comprises forming a tunneling dielectric layer on the substrate and a first conductive layer, such as a first polysilicon layer, on the tunneling dielectric layer. Then, patterning the first conductive layer, the tunneling dielectric layer and the substrate to form trenches therein before a gap-filling material is refilled into the trenches and over the substrate. A portion of the gap-filling material is removed to form trench isolations. A portion of the trench isolation is etched to form slots between the etched first conductive layer. Next, a second conductive layer is formed over a surface of the slots and the etched first conductive layer. The second conductive layer is etched, thereby forming sidewall spacers on the slot where the spacers are not higher than the top surface of the first conductive layer. The next step is to form a second dielectric layer on the trench isolation, the sidewall spacers and the first conductive layer; and forming a third conductive layer on the second dielectric layer to act as a control gate.

The flash memory structure includes a substrate having trenches formed therein, a first dielectric layer and a first conductive layer are stacked on the substrate. Isolations are formed in the trenches and protruding over the surface of the substrate, wherein the first conductive layer is also protruded over the isolations. A second conductive layer is lying the surface of the first conductive layer and a second dielectric layer formed thereon. A third conductive layer is formed on the second dielectric layer. The floating gate is consisted of first conductive layer and the second conductive layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 and FIG. 2B are two cross sectional views of a semiconductor wafer illustrating both the step of forming trench isolation and the step of forming slots according to the present invention.

FIG. 3A is a cross sectional view of a semiconductor wafer illustrating the

DETAILED DESCRIPTION OF THE PREFERRED EMBODIMENT

The present invention proposes a novel method to fabricate a flash nonvolatile memory. In the method, trench and the floating gate are simultaneously formed in one step. The structure can form self-aligned silicon island structure. During the formation of trench, the substrate does not need to be switched to another chamber due to the floating gate and substrate are composed of identical material. The detail description will be seen as follows.

Figure 4:
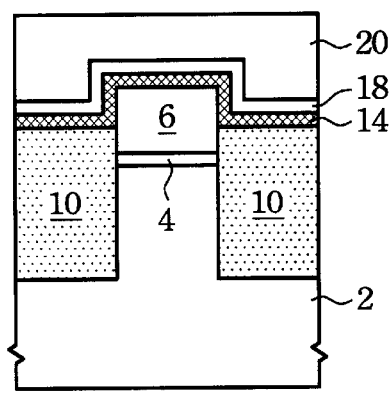
FIGS. 4–4B are cross sectional views of a semiconductor wafer illustrating the step of forming dielectric layer and control gate according to FIGS. 3–3A of the present invention.

The first embodiment of the structure, as shown in FIG. 4, includes a substrate 2 having trenches formed therein, a first dielectric layer 4 and a first conductive layer are stacked on the substrate 2. Isolations 10 are formed in the trenches and protruding over the surface of the substrate 2, wherein the first conductive layer 6 is also protruded over the isolations 10. A second conductive layer 14 is lying over the surface of the first conductive layer 6 and a second dielectric layer 18 is formed thereon. A third conductive layer 20 is formed on the second dielectric layer 18. The floating gate consists of the first conductive layer 6 and the second conductive layer 14.

Figure 4A:
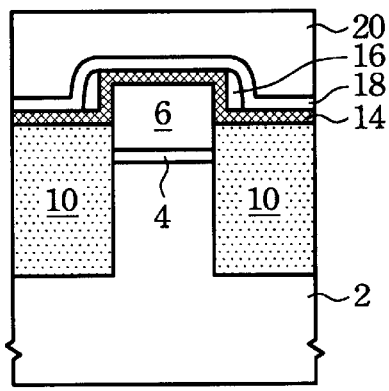

Alternatively, further sidewall spacers 16 are attached on the side wall of the floating gate consisting of first conductive layer 6 and the second dielectric layer 18, as shown in FIG. 4A.

Figure 4B:
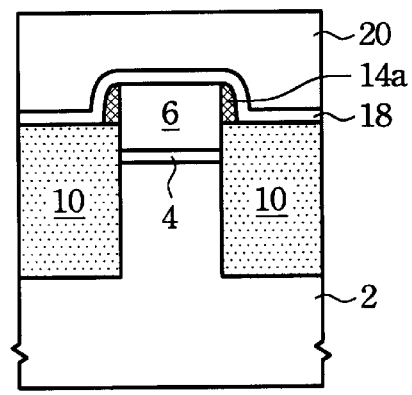

Another embodiment can be seen in FIG. 4b, the second conductive layer 14 is omitted and the spacers 14a are attached on the floating gate consisting of first conductive layer 6 only. Yet another embodiment of the present invention is that even the spacers 14a are also abridged, referring to 5.

The processes for forming the devices are described as follows.

A semiconductor substrate is provided for the present invention. In a preferred embodiment, as shown in the FIG. 1, a single crystal silicon substrate with a <100> or <111> crystallographic orientation is provided. A thin tunneling dielectric layer 4 consisting of silicon oxide is formed on the substrate 2. Typically, the oxide 4 can be grown in oxygen ambient at a temperature of about 700 to 1100 degrees centigrade. Other methods, such as chemical vapor deposition, can also form the gate oxide 4. In the embodiment, the thickness of the silicon dioxide layer 4 is approximately 15–250 angstroms. Subsequently, a conductive layer such as doped polysilicon layer 6 or metal is deposited on the tunneling dielectric layer 4. Generally, the polysilicon layer 6 is chosen from doped polysilicon or in-situ polysilicon. For an embodiment, the doped polysilicon layer 6 is doped by phosphorus using a $PH_3$ source.

Figure 1:
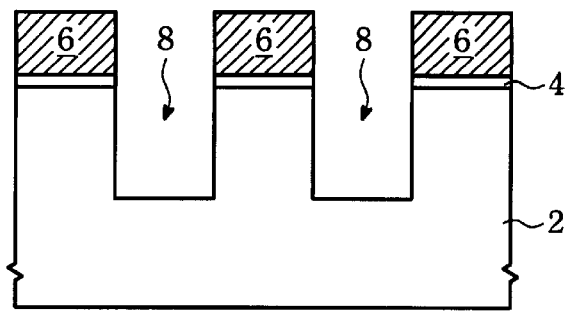
FIG. 1 is a cross sectional view of a semiconductor wafer illustrating the steps of forming trenches in a semiconductor substrate according to the present invention.

Next, still referring to FIG. 1, standard lithography and etching steps are used to etch the polysilicon layer 6, tunneling dielectric layer 4 and into the substrate 2 to a depth to form trenches 8 in the substrate. In the step, the isolation area and the floating gate 6 are simultaneously formed. This method provides self-aligned floating gate. In this case, the dry etching uses $CF_4+O_2$ plasma. A gap filling material 10, such as oxide formed by a CVD system, which is referred to as CVD-oxide, is refilled into the trenches 8 for isolation. Preferably, the oxide layer 10 is formed at a temperature in the range of about 400 to 600 degrees centigrade. A chemical mechanical polishing (CMP) technology is used to remove the top of the CVD-oxide 10 to the surface of the conductive layer 6.

Figure 2:
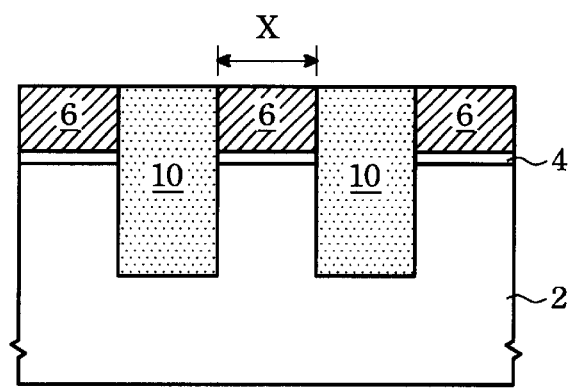
Figure 3:
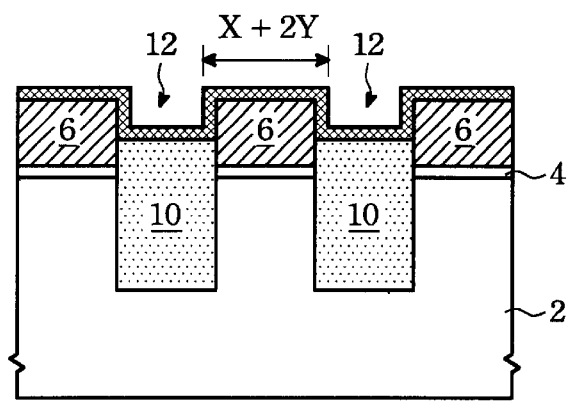
FIG. 3 is a cross sectional view of a semiconductor wafer illustrating the steps of etching the isolations and forming floating gate according to the present invention.

Referring to FIG. 2B and FIG. 3, an etching back process is performed to etch the oxide 10 using the high selectivity etching between oxide and silicon. The upper portion of the oxide 10 is removed to form slots 12 between the floating gates 10, and the depth of the slots from the surface of the floating gate 10 can be defined by the etching. A second conductive layer 14 is conformally formed along the surface of the floating gate 6 and the slot 12. The conductive layer 6 and the second conductive layer 14 are combined to act the floating gate. If the width of the first conductive layer 6 is x, the thickness of the second conductive layer 14 is y, thus the upper surface area of the floating gate is approximately x+2y. It can improve the coupling ration. An etching is optionally used to etch the second conductive layer 14 to form spacers 14a on the side wall of the slot 12, as shown in FIG. 3B.

Figure 3A:
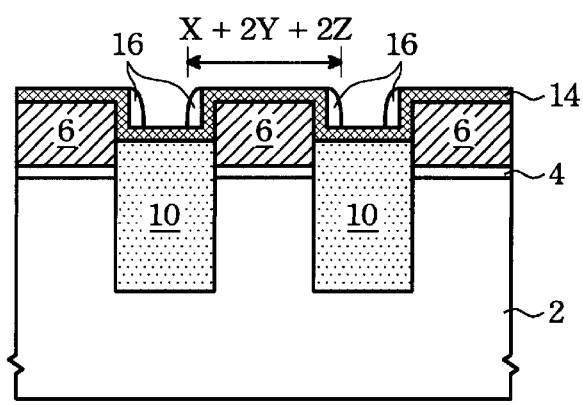
Figure 3B:
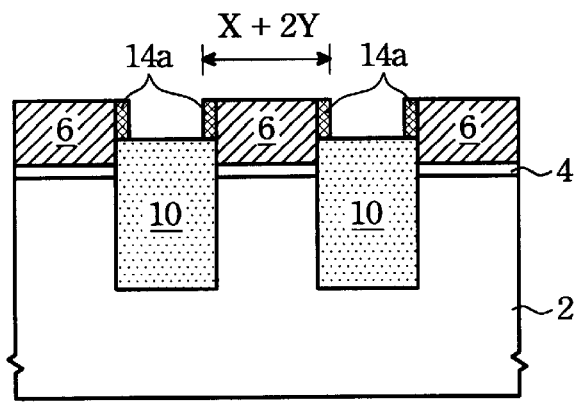
FIG. 3B is a cross sectional view of a semiconductor wafer illustrating the step of forming sidewall spacers according to the present invention.

Another embodiment is shown in FIG. 3A, sidewall spacers 16 are formed in the slot 12 and attached on the sidewall of the second conductive layer 14. The sidewall spacers 16 are formed by well known anisotropically etching. Assume again that the thickness of the sidewall spacers 16 is Z, then the upper surface of the floating gate is about X+2Y+2Z.

Next, please turn to FIGS. 4–4B, an inter polysilicon dielectric (IPD) 18 is formed at the top of the floating gate. Preferably, the ONO (oxide/nitride/oxide) or NO is used as the IPD 18. Finally, a third conductive layer 20, such as doped polysilicon layer or metal 16, is formed on the IPD 18 as control gate. The doped polysilicon layer 20 can be chosen from doped polysilicon or in-situ doped polysilicon. In addition, the metal or alloy layer can be used as the conductive layer 20.

Figure 5:
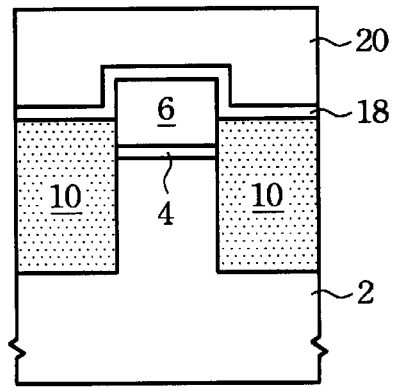
FIG. 5 is a further cross sectional view of the present invention.

Turning to FIG. 5, alternatively, the dielectric layer may directly be formed 18 on the surface of the etched first conductive layer 6, followed by forming the layer 20.

In the process of this invention, a tunnel oxide layer, floating gate and the trench are defined at the same time. Namely, the floating gate and tunnel oxide simultaneously are self-aligned formed adjacent to the shallow trench isolation. Further, the present invention provides a benefit of that the substrate does not need to be switched to another chamber during the trench etching due to the floating gate and substrate are composed of the same material.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A nonvolatile memory comprising:

a substrate having trenches formed therein;

a first dielectric layer formed on said substrate;

a first conductive layer stacked on said first dielectric layer;

isolations formed in said trenches and protruding over a surface of said substrate, wherein said fist conductive layer is also protruded over said isolations;

a second conductive layer formed on a surface of said first conductive layer;

a second dielectric layer formed on a surface of said second conductive layer;

a third conductive layer formed on said second conductive layer as a control gate; and a floating gate comprising said first conductive layer and said second conductive layer, the upper surface area of said first conductive layer and said second conductive layer forming said floating gate area in geometrical proportion.

2. A nonvolatile memory comprising:

a substrate having trenches formed therein;

a first dielectric layer formed on said substrate;

a first conductive layer stacked on said first dielectric layer;

isolations formed in said trenches and protruding over a surface of said substrate, wherein said first conductive layer is also protruded over said isolations;

a second conductive layer formed on a surface of said first conductive layer;

a second dielectric layer formed on a surface of said second conductive layer;

a conductive sidewall spacer formed on sidewall of opening, connecting with said first conductive layer and said second conductive layer;

a third conductive layer formed on said second conductive layer as a control gate; and a floating gate comprising said first conductive layer, said second conductive layer and said conductive sidewall spacer, the upper surface area of said first conductive layer, said second conductive layer and said conductive sidewall spacer forming said floating gate area in geometrical proportion.

3. The nonvolatile memory of claim 2, wherein said first conductive layer and said second conductive layer are selected from polysilicon, alloy or metal.

4. The nonvolatile memory in claim 1, wherein the geometrical proportion of said first conductive layer of width x and said second conductive layer of thickness y of said floating gate on upper surface area is x+2y.

5. The nonvolatile memory in claim 1, wherein said nonvolatile memory further comprises a conductive sidewall spacer of thickness z formed on sidewall of opening, which is connected with said first conductive layer and said second conductive layer and further forms said floating gate.

6. The nonvolatile memory in claim 5, wherein the geometrical proportion of said first conductive layer, said second conductive layer and said conductive sidewall spacer on upper surface area of floating gate is x+2y+2z.

7. The nonvolatile memory in claim 2, wherein the geometrical proportion of said first conductive layer of width x, said second conductive layer of thickness y and said conductive sidewall spacer of thickness z on upper surface area of floating gate is x+2y+2z.

* * * * *